US007164567B2

United States Patent
Litwin et al.

(10) Patent No.: US 7,164,567 B2
(45) Date of Patent: Jan. 16, 2007

(54) DEVICE FOR ESD PROTECTION OF AN INTEGRATED CIRCUIT

(75) Inventors: Andrej Litwin, Danderyd (SE); Ola Pettersson, Järfälla (SE)

(73) Assignee: Infineon Technologies AG, Munich (DE)

( * ) Notice: Subject to any disclaimer, the term of this patent is extended or adjusted under 35 U.S.C. 154(b) by 408 days.

(21) Appl. No.: 10/874,125

(22) Filed: Jun. 22, 2004

(65) Prior Publication Data
US 2005/0047037 A1    Mar. 3, 2005

(30) Foreign Application Priority Data
Aug. 27, 2003   (SE) .................................. 0302296

(51) Int. Cl.
*H02H 3/22* (2006.01)
(52) U.S. Cl. ........................................ 361/56; 361/111
(58) Field of Classification Search .................. 361/56, 361/111; 257/355, 356, 270, 274
See application file for complete search history.

(56) References Cited

U.S. PATENT DOCUMENTS

| | | | |
|---|---|---|---|
| 4,710,791 A | 12/1987 | Shirato et al. | 357/23.13 |
| 4,730,208 A | 3/1988 | Sugino et al. | 357/23.8 |
| 4,806,999 A | 2/1989 | Strauss | 357/23.13 |
| 4,876,584 A | 10/1989 | Taylor | 356/23.13 |
| 5,196,913 A | 3/1993 | Kim et al. | 357/23.13 |
| 5,615,073 A | 3/1997 | Fried et al. | 361/56 |
| 5,808,343 A | 9/1998 | Pilling et al. | 257/358 |
| 6,037,636 A | 3/2000 | Crippen | 257/355 |
| 6,181,214 B1 * | 1/2001 | Schmitt et al. | 331/62 |
| 6,292,046 B1 | 9/2001 | Ali | 327/310 |
| 6,331,726 B1 | 12/2001 | Voldman | 257/541 |
| 6,496,341 B1 | 12/2002 | Chen et al. | 361/56 |

FOREIGN PATENT DOCUMENTS

EP     0 371 663 A1   11/1989
WO    WO 03/021737 A1  3/2003

* cited by examiner

*Primary Examiner*—Brian Sircus
*Assistant Examiner*—Danny Nguyen
(74) *Attorney, Agent, or Firm*—Baker Botts L.L.P.

(57) ABSTRACT

A device for ESD protection of a high frequency circuit (1) of a semiconductor device comprises first (3) and second (4) p-type and first (6) and second (5) n-type JFET's, wherein the first p-type JFET (3) is connected with its gate to a high voltage source, its source to an input/output pad (2) of the semiconductor device, and its drain to the source of the first n-type JFET (6), the second p-type JFET (4) is connected with its gate to the high voltage source, its source to the drain of the second n-type JFET (5), and its drain to an input/output terminal of the circuit (1), the first n-type JFET transistor (6) is connected with its gate to ground (GND), and its drain to the input/output terminal, and the second n-type JFET transistor (5) is connected with its gate to ground (GND), and its source to the input/output pad (2).

18 Claims, 3 Drawing Sheets

DEVICE FOR ESD PROTECTION OF AN INTEGRATED CIRCUIT

PRIORITY

This application claims priority to Swedish application no. 0302296-9 filed Aug. 27, 2003.

TECHNICAL FIELD OF THE INVENTION

The present invention generally relates to the field of integrated circuit technology, and more specifically the invention relates to a monolithically integrated device for ESD (electrostatic discharge) protection of an integrated circuit.

DESCRIPTION OF RELATED ART AND BACKGROUND OF THE INVENTION

Integrated electrostatic discharges may damage electronic devices, particularly electronic semiconductor devices fabricated on insulating or semi-insulating substrates, such as integrated circuits. Devices for protecting against ESD are conventionally incorporated in the input/output paths of most semiconductor devices in order to shunt excessive charge away from the sensitive circuits of the semiconductor devices.

Semiconductor devices are often provided with some protection against high input currents, such as e.g. electrical resistors connected in their input paths, thereby limiting the input current. These resistors are conventionally located outside the bonding pads of the semiconductor devices, thereby occupying valuable chip area.

In U.S. Pat. No. 4,806,999 an integrated circuit is disclosed, which has an input pad protected from electrostatic discharge by two diodes located under the periphery of the pad. One of the diodes is typically formed in an n-tub, and the other in a p-tub. In one embodiment the boundary between the tubs is located in a region not overlaid by the exposed portion of the pad. An input resistor is optionally included between the pad and the input circuitry for additional ESD protection.

In U.S. Pat. No. 4,876,584 an integrated circuit is disclosed, which has a terminal pad protected by a diode directly connected between the pad and a power supply, a transistor directly connected to another power supply, and a resistive path connecting the pad to the remainder of the integrated circuit.

A similar ESD protection structure is disclosed in EP 0 371 663 A1, where the resistor is formed as a metal silicide link located horizontally outside the pad.

Other similar ESD protection structures including a resistor in an input and/or output path are disclosed in U.S. Pat. Nos. 5,808,343, 5,615,073, 5,196,913, 4,730,208 and 4,710,791.

For high frequency applications at gigahertz frequencies, however, the mentioned resistor creates several problems. The RC product of the circuit input capacitance and the ESD resistor set the limit of the highest operation frequency. Furthermore, the resistance itself creates noise, which is deleterious in low noise applications. It would be highly advantageous for high frequency circuits if the resistor could assume a low value during normal operation and high value during the ESD protection.

A solution to this problem is to provide a varistor in the ESD protection circuit, see WO03/021737. The varistor has a low resistance value while operating in the voltage regime normal for the circuit function and a high resistance value while subject to the voltage exceeding this normal voltage, e.g. during an ESD event. Diodes are connected as current shunting devices.

Another ESD protection circuit is disclosed in U.S. Pat. No. 6,331,726 B1. A ballasting resistor, which includes a pair of N+ regions, a P− body region formed between the N+ regions, and a pair of P+ nodes connected to the P− body region, reduces a current there through by utilizing a pinching effect. The ballasting resistor is biased in such a manner that the PN junctions are reverse-biased to pinch down the cross-sectional area of the current path provided inside the P− body region between the nodes as an applied voltage increases.

SUMMARY OF THE INVENTION

A disadvantage of the prior art solution disclosed in WO03/021737 is that the structure adds to the parasitic capacitance and slows down the circuit. Further, when using CMOS circuits on thin SOI (Silicon-on-insulator) wafers, where the active silicon layer is at the most a few tenths of micrometer thick, the vertical shunting devices of WO03/021737 are virtually impossible to realize.

A disadvantage of the prior art circuit disclosed in U.S. Pat. No. 6,331,726 B1 is that it does not effectively protect the circuit from both positive and negative high amplitude voltage pulses since the pinching effect occurs only for either positive or negative voltages depending on the doping type of the resistor.

Accordingly, it is an object of the present invention to provide a device for ESD protection of a circuit, particularly a high frequency circuit, of a semiconductor device, which overcomes the problems and limitations associated with the prior art devices.

It is a particular object of the invention to provide such a device, which uses components feasible in SOI CMOS technology, so that the device can be fabricated in a standard CMOS process without the need of additional processing steps.

It is a further particular object of the invention to provide such a device, which is capable of protecting a high frequency integrated circuit against excessive positive and negative voltages.

It is a yet further object of the invention to provide such a device, which adds a very low parasitic capacitance to the circuit, thereby not essentially affecting the speed of the circuit.

These objects can be attained, according to the present invention, by a device for electrostatic discharge (ESD) protection of a circuit, particularly a high frequency circuit, of a semiconductor device, wherein the device for ESD protection comprises a first and a second p-type junction field effect transistor (JFET) and a first and second n-type JFET transistor, wherein the first p-type JFET transistor is connected with its gate to a high voltage source, its source to an input/output pad of the semiconductor device, and its drain to the source of the first n-type JFET transistor, the second p-type JFET transistor is connected with its gate to the high voltage source, its source to the drain of the second n-type JFET transistor, and its drain to an input/output terminal of the circuit, the first n-type JFET transistor is connected with its gate to ground, and its drain to the input/output terminal of the circuit, and the second n-type JFET transistor is connected with its gate to ground, and its source to the input/output pad of the semiconductor device.

The objects can also be attained by a device for electrostatic discharge (ESD) protection of a circuit, particularly a high frequency circuit, of a semiconductor device, comprising a first n-type JFET transistor connected with its gate to ground, and its drain to the input/output terminal of the circuit, a second n-type JFET transistor connected with its gate to ground, and its source to the input/output pad of the semiconductor device, a first p-type junction field effect transistor (JFET) connected with its gate to a high voltage source, its source to an input/output pad of the semiconductor device, and its drain to the source of the first n-type JFET transistor, and a second p-type junction field effect transistor (JFET) connected with its gate to the high voltage source, its source to the drain of the second n-type JFET transistor, and its drain to an input/output terminal of the circuit.

The semiconductor device can be a silicon-on-insulator (SOI) substrate based device. Each of the JFET transistors can be a lateral JFET transistor with its gate, source and drain arranged in a common layer. Each of the JFET transistors can be provided with a ladder kind of type channel region and a plurality of gate regions. The circuit can be a CMOS-based high frequency (HF) or radio frequency (RF) circuit. The device for ESD protection may have a resistance optimized for the circuit. Each of the JFET transistors can be designed to operate in a linear region at normal operating voltages of the semiconductor device, and in a saturated region at voltages higher than the operating voltages.

By providing first and second p-type JFET's (unction field effect transistor) and first and second n-type JFET's, wherein the first p-type JFET is connected with its gate to a high voltage source, its source to an input/output pad of the semiconductor device, and its drain to the source of the first n-type JFET, the second p-type JFET is connected with its gate to the high voltage source, its source to the drain of the second n-type JFET, and its drain to an input/output terminal of the circuit, the first n-type JFET is connected with its gate to ground, and its drain to the circuit input/output terminal, and the second n-type JFET is connected with its gate to ground and its source to the input/output pad, a device for ESD protection is achieved, which protects the circuit from being damaged by excessive positive and negative voltage pulses, and which is feasible in standard SOI CMOS technology.

The p-type and n-type JFET's are preferably lateral SOI-based JFET's.

Further characteristics of the invention and advantages thereof will be evident from the detailed description of preferred embodiments of the present invention given hereinafter and the accompanying FIGS. 1–4, which are given by way of illustration only, and thus are not limitative of the present invention.

DETAILED DESCRIPTION OF PREFERRED EMBODIMENTS

Figure 1:
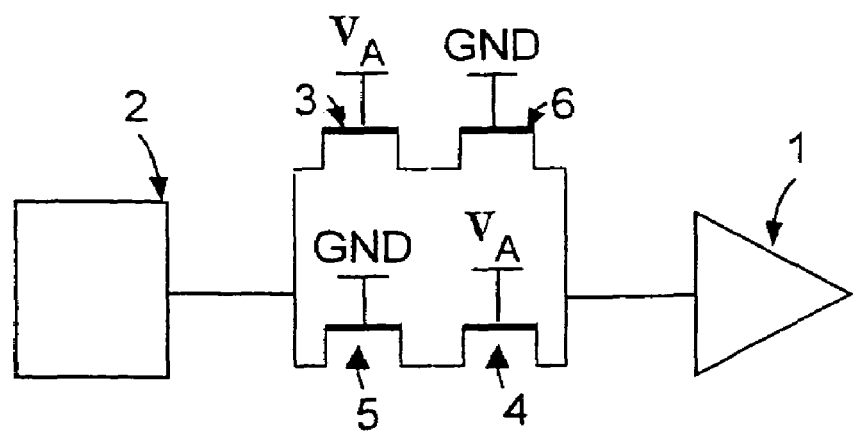
FIG. 1 is a circuit schematic of an ESD protective circuit using JFET transistors according to a preferred embodiment of the present invention.

In FIG. 1 a monolithically integrated ESD protection device according to a preferred embodiment of the present invention is schematically shown. The device includes lateral JFET transistors, which combine the functions of current limitation and current shunting.

The ESD protection device is interconnected between an input/output terminal of a high frequency or radio frequency MOS circuit 1, e.g. a receiver or driver circuit, and an input/output bonding pad 2. The semiconductor device comprising the MOS circuit 1, the ESD protection device, and the bonding pad 2 is preferably a SOI substrate based device.

The ESD protection device comprises a first 3 and a second 4 lateral p-type JFET (unction field effect transistor) and a first 6 and second 5 lateral n-type JFET interconnected in a cross-coupled configuration as illustrated.

That is, the first p-type JFET 3 is connected with its gate to a high voltage source VA of the semiconductor device, its source to an input/output pad 2 of the semiconductor device, and its drain to the source of the first n-type JFET 6. The second p-type JFET 4 is connected with its gate to the high voltage source VA, its source to the drain of the second n-type JFET transistor 5, and its drain to an input/output terminal of the MOS circuit 1. Further, the first n-type JFET transistor 6 is connected with its gate to ground GND and its drain to the input/output terminal of the circuit 1. Finally, the second n-type JFET 5 is connected with its gate to ground GND, and its source to the input/output pad 2.

The current path between the source and the drain of each JFET pair exhibits current limiting characteristics independently of the ESD pulse voltage sign since each pair includes both n and p type transistors. Thus, the ESD protection device has a low resistance value, while operating in the voltage regime normal for the operation of the circuit 1, and a high resistance value while subject to a positive or negative voltage exceeding the normal voltage regime, e.g. during ESD event. Further, the drain-gate and the source-gate diodes operate as lateral shunting devices.

It shall be appreciated that the total resistance of the ESD protection device shall be optimized for the circuit 1 and its operation.

The preferred physical realizations of the JFET's used in the device of FIG. 1 are illustrated in FIGS. 2–3.

Figure 2A:
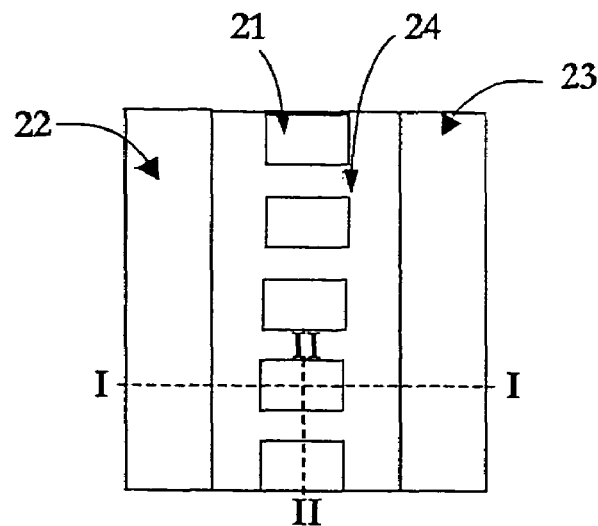
FIGS. 2a–c are highly enlarged schematic layout and cross-sectional views of a p-type JFET transistor as being used in the circuit of FIG. 1.

In FIG. 2a a schematic layout view of a p-type JFET transistor is shown, wherein 21 denotes a plurality of n+-type doped gate regions, 22 and 23 denote p+-type doped source and drain regions, and 24 denotes a lightly p-type doped channel region. As can be seen in FIG. 2a the JFET is provided with a ladder kind of type channel region 24, and a plurality of gate regions located like islands in the channel region 24, thereby defining a plurality of parallel p-type doped channels extending from the source region 22 to the drain region 23.

Figure 2B:
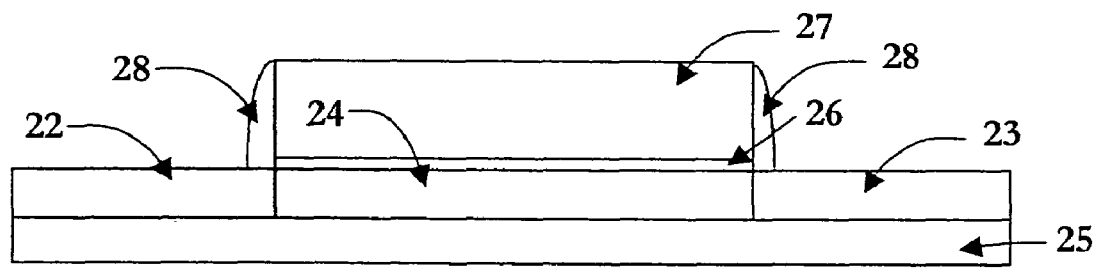
Figure 2C:
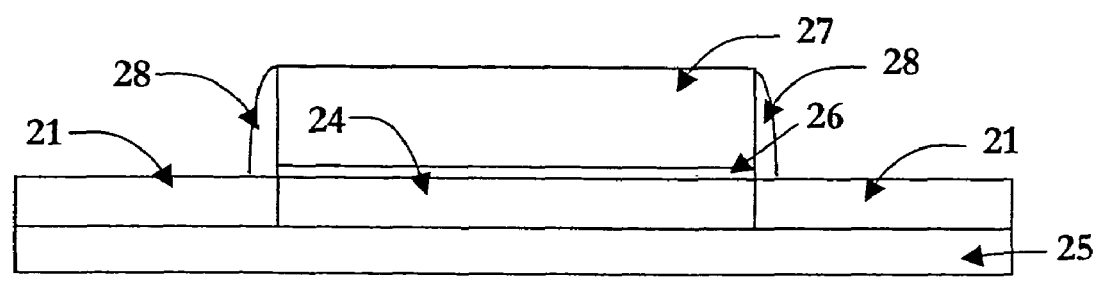

In FIGS. 2b and 2c schematic cross-sectional views along lines I—I and II—II, respectively, in FIG. 2a are shown. In these views it can be seen that the JFET is a lateral device on a SOI substrate. The gate regions 21, the source and drain regions 22, 23 and the channel region 24 are located laterally separated from each other on top of an insulating layer, i.e. a silicon dioxide layer 25.

The source and drain regions 22, 23 are heavily doped, whereas the doping concentration level of the channel region 24 is some orders of magnitude lower. To avoid the high doping concentration level in the channel region 24, it is protected by a structure comprising a silicon dioxide layer 26, a polycrystalline layer 27 thereon, and outside spacers 28, which in the CMOS process are used for achieving gate structures for CMOS transistors. However, this polycrystalline layer 27 of the lateral JFET is preferably not connected to any terminal. Further, the source and drain regions 22, 23 may be silicided to reduce the resistance of the source-drain current path.

Figure 3A:
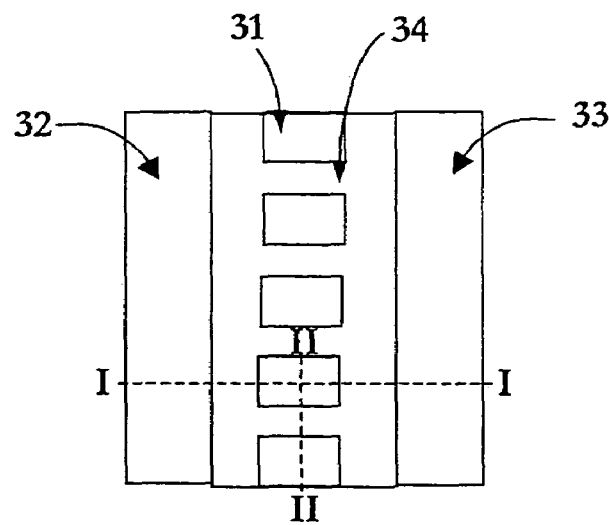
FIGS. 3a–c are highly enlarged schematic layout and cross-sectional views of an n-type JFET transistor as being used in the circuit of FIG. 1.
Figure 3B:
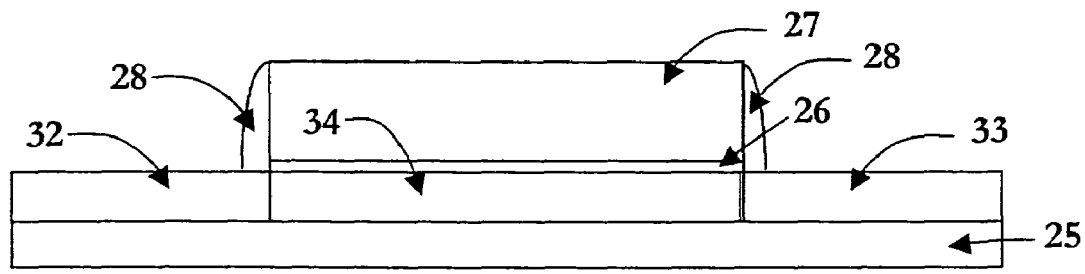
Figure 3C:
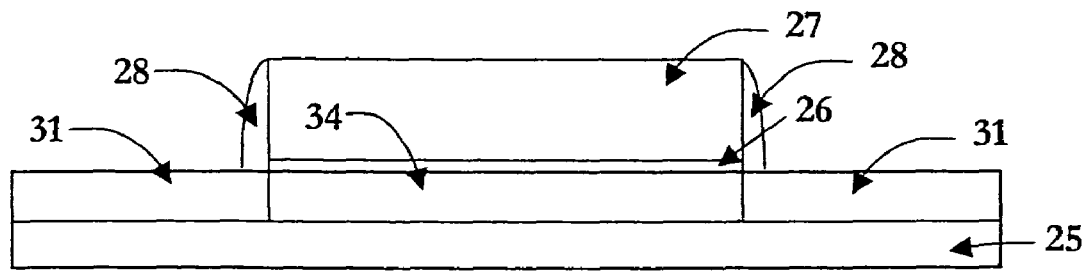

In FIG. 3a a schematic circuit layout of an n-type JFET transistor is illustrated. Here, 31 denotes a plurality of p+-type doped gate regions, 32 and 33 denote n+-type doped source and drain regions, and 34 denotes a lightly n-type doped channel region. In other respects, the n-type JFET is identical with the p-type JFET. FIGS. 3b and 3c are schematic cross-sectional views corresponding to those of FIGS. 2b and 2c.

Figure 4:
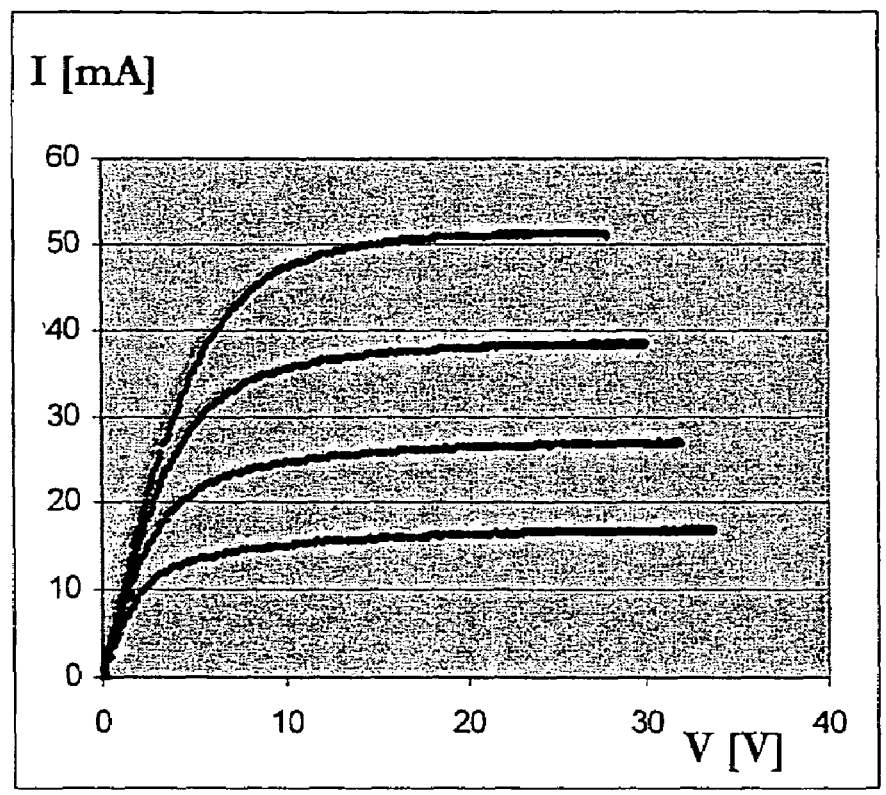
FIG. 4 is a diagram of source-drain current versus source-drain voltage for different gate bias voltages of any of the n-type JFET transistors as used in the present invention.

FIG. 4, finally, is a diagram of source-drain current I versus source-drain voltage V for different gate bias voltages of any of the n-type JFET transistors as used in the present invention. If the gate and the source of the transistor are at the same potential, i.e. short-circuited, the I–V characteristics of the transistor will be described by the uppermost curve. For p-type JFET transistors the signs of current and voltage will be reversed.

Each of the JFET's of the invention is designed to operate in the linear region at normal operating voltages for the semiconductor device, and in the saturated region at voltages higher than the operating voltages.

We claim:

1. A device for electrostatic discharge (ESD) protection of a circuit, particularly a high frequency circuit, of a semiconductor device, wherein said device for ESD protection comprises a first and a second p-type junction field effect transistor (JFET) and a first and second n-type JFET transistor, wherein
    said first p-type JFET transistor is connected with its gate to a high voltage source, its source to an input/output pad of said semiconductor device, and its drain to the source of said first n-type JFET transistor,
    said second p-type JFET transistor is connected with its gate to said high voltage source, its source to the drain of said second n-type JFET transistor, and its drain to an input/output terminal of said circuit,
    said first n-type JFET transistor is connected with its gate to ground, and its drain to said input/output terminal of said circuit, and
    said second n-type JFET transistor is connected with its gate to ground, and its source to said input/output pad of said semiconductor device.

2. The device for ESD protection of claim 1, wherein said semiconductor device is a silicon-on-insulator (SOI) substrate based device.

3. The device for ESD protection of claim 1, wherein each of said JFET transistors is a lateral JFET transistor with its gate, source and drain arranged in a common layer.

4. The device for ESD protection of claim 2, wherein each of said JFET transistors is a lateral JFET transistor with its gate, source and drain arranged in a common layer.

5. The device for ESD protection of claim 3, wherein each of said JFET transistors is provided with a ladder kind of type channel region and a plurality of gate regions.

6. The device for ESD protection of claim 4, wherein each of said JFET transistors is provided with a ladder kind of type channel region and a plurality of gate regions.

7. The device for ESD protection of claim 1, wherein said circuit is a CMOS-based high frequency (HF) or radio frequency (RF) circuit.

8. The device for ESD protection of claim 1, wherein said device for ESD protection has a resistance optimized for said circuit.

9. The device for ESD protection of claim 1, wherein each of said JFET transistors is designed to operate in a linear region at normal operating voltages of said semiconductor device, and in a saturated region at voltages higher than said operating voltages.

10. A device for electrostatic discharge (ESD) protection of a circuit, particularly a high frequency circuit, of a semiconductor device, comprising:
    a first n-type JFET transistor connected with its gate to ground, and its drain to said input/output terminal of said circuit,
    a second n-type JFET transistor connected with its gate to ground, and its source to said input/output pad of said semiconductor device,
    a first p-type junction field effect transistor (JFET) connected with its gate to a high voltage source, its source to an input/output pad of said semiconductor device, and its drain to the source of said first n-type JFET transistor,
    a second p-type junction field effect transistor (JFET) connected with its gate to said high voltage source, its source to the drain of said second n-type JFET transistor, and its drain to an input/output terminal of said circuit.

11. The device for ESD protection of claim 10, wherein said semiconductor device is a silicon-on-insulator (SOI) substrate based device.

12. The device for ESD protection of claim 10, wherein each of said JFET transistors is a lateral JFET transistor with its gate, source and drain arranged in a common layer.

13. The device for ESD protection of claim 11, wherein each of said JFET transistors is a lateral JFET transistor with its gate, source and drain arranged in a common layer.

14. The device for ESD protection of claim 12, wherein each of said JFET transistors is provided with a ladder kind of type channel region and a plurality of gate regions.

15. The device for ESD protection of claim 13, wherein each of said JFET transistors is provided with a ladder kind of type channel region and a plurality of gate regions.

16. The device for ESD protection of claim 10, wherein said circuit is a CMOS-based high frequency (HF) or radio frequency (RF) circuit.

17. The device for ESD protection of claim 10, wherein said device for ESD protection has a resistance optimized for said circuit.

18. The device for ESD protection of claim 10, wherein each of said JFET transistors is designed to operate in a linear region at normal operating voltages of said semiconductor device, and in a saturated region at voltages higher than said operating voltages.

* * * * *